(12) United States Patent
Yoon et al.

(10) Patent No.: US 10,043,968 B2
(45) Date of Patent: Aug. 7, 2018

(54) ELECTRONIC DEVICE

(71) Applicants: SK hynix Inc., Gyeonggi-do OT (KR); TOSHIBA MEMORY CORPORATION, Tokyo OT (JP)

(72) Inventors: Sung-Joon Yoon, Gyeonggi-do (KR); Tadashi Kai, Tokyo (JP)

(73) Assignees: SK Hynix Inc., Gyeonggi-do (KR); Toshiba Memory Corporation, Tokyo (JP)

( * ) Notice: Subject to any disclaimer, the term of this patent is extended or adjusted under 35 U.S.C. 154(b) by 371 days.

(21) Appl. No.: 14/562,468

(22) Filed: Dec. 5, 2014

(65) Prior Publication Data

US 2015/0249208 A1   Sep. 3, 2015

(30) Foreign Application Priority Data

Mar. 3, 2014 (KR) .................. 10-2014-0025114

(51) Int. Cl.
| | |
|---|---|
| *G06F 13/36* | (2006.01) |
| *H01L 43/08* | (2006.01) |
| *H01L 27/22* | (2006.01) |
| *G11C 11/16* | (2006.01) |
| *G06F 13/40* | (2006.01) |

(Continued)

(52) U.S. Cl.
CPC ............ *H01L 43/08* (2013.01); *G11C 11/161* (2013.01); *G11C 11/1659* (2013.01); *H01L 27/222* (2013.01); *G06F 12/084* (2013.01); *G06F 13/28* (2013.01); *G06F 13/4022* (2013.01); *G06F 13/4027* (2013.01); *G06F 2212/1028* (2013.01);

(Continued)

(58) Field of Classification Search
None
See application file for complete search history.

(56) References Cited

U.S. PATENT DOCUMENTS

| | | | |
|---|---|---|---|
| 7,326,982 B2 | 2/2008 | Iwata et al. | |
| 8,218,355 B2 * | 7/2012 | Kitagawa | G11C 11/16 257/421 |

(Continued)

OTHER PUBLICATIONS

Yiming Huai et al., Structure, Materials and Shape Optimization of Magnetic Tunnel Junction Devices: Spin-Transfer Switching Curent Reduction for Future Magnetoresistive Random Access Memory Application, Japanese Journal of Applied Physics, vol. 45, No. 5A, 2006, pp. 1-7.*

*Primary Examiner* — Henry Tsai
*Assistant Examiner* — Aurangzeb Hassan
(74) *Attorney, Agent, or Firm* — IP & T Group LLP

(57) ABSTRACT

There is disclosed an electronic device comprising a semiconductor memory unit capable of reducing the switching current of a variable resistance element that switches between different resistance states. In an implementation, an electronic device includes a semiconductor memory unit that includes a variable resistance element comprising a first magnetic layer configured to have a magnetization direction pinned, a second magnetic layer configured to have a magnetization direction not pinned, and a non-magnetic layer interposed between the first magnetic layer and the second magnetic layer, wherein the variable resistance element comprises plane shapes having a plurality of edges, and the number of angled edges is larger than the number of rounded edges as a damping constant of the second magnetic layer increase.

16 Claims, 10 Drawing Sheets

(51) Int. Cl.
*G06F 13/28* (2006.01)
*G06F 12/084* (2016.01)

(52) U.S. Cl.
CPC ............... *G06F 2212/1048* (2013.01); *G06F 2212/601* (2013.01); *Y02D 10/13* (2018.01)

(56) References Cited

U.S. PATENT DOCUMENTS

| | | | | |
|---|---|---|---|---|
| 8,378,438 B2* | 2/2013 | Apalkov | ................ | B82Y 25/00 257/421 |
| 8,553,450 B2* | 10/2013 | Hosotani | ................ | G11C 11/16 365/158 |
| 9,147,442 B2* | 9/2015 | Yi | ................ | G11C 13/0028 |
| 9,331,267 B2* | 5/2016 | Song | ................ | H01L 27/228 |
| 9,831,286 B2* | 11/2017 | Kim | ................ | H01L 27/228 |
| 2007/0086121 A1* | 4/2007 | Nagase | ................ | B82Y 25/00 360/324.1 |
| 2007/0253120 A1* | 11/2007 | Saito | ................ | B82Y 25/00 360/324.11 |
| 2008/0247225 A1* | 10/2008 | Liu | ................ | G11C 13/0004 365/163 |
| 2009/0317923 A1* | 12/2009 | Sun | ................ | B82Y 25/00 438/3 |
| 2010/0238718 A1* | 9/2010 | Asao | ................ | G11C 11/16 365/158 |
| 2011/0044096 A1 | 2/2011 | Li | | |
| 2011/0233696 A1* | 9/2011 | Li | ................ | G11C 11/5607 257/421 |
| 2011/0272664 A1* | 11/2011 | Tada | ................ | H01L 27/228 257/4 |
| 2012/0063218 A1* | 3/2012 | Huai | ................ | G11C 11/16 365/171 |
| 2012/0063219 A1 | 3/2012 | Klein et al. | | |
| 2012/0142141 A1* | 6/2012 | Park | ................ | H01L 45/04 438/102 |
| 2012/0280336 A1* | 11/2012 | Jan | ................ | H01L 43/08 257/421 |
| 2013/0078482 A1* | 3/2013 | Shukh | ................ | G11B 5/3909 428/811.1 |
| 2014/0175369 A1* | 6/2014 | Murase | ................ | H01L 45/08 257/4 |
| 2014/0287535 A1* | 9/2014 | Kim | ................ | H01L 45/1675 438/3 |
| 2015/0041748 A1* | 2/2015 | Hayakawa | ................ | H01L 27/24 257/2 |
| 2015/0171324 A1* | 6/2015 | Mikawa | ................ | H01L 27/1021 257/4 |
| 2015/0340606 A1* | 11/2015 | Tada | ................ | G11C 13/0002 257/4 |

* cited by examiner

ELECTRONIC DEVICE

CROSS-REFERENCE TO RELATED APPLICATIONS

The present application claims priority of Korean Patent Application No, 10-2014-0025114, entitled "ELECTRONIC DEVICE" and filed on Mar. 3, 2014, which is incorporated herein by reference in its entirety.

BACKGROUND

1. Field

This patent document relates to memory circuits or devices and their applications in electronic devices or systems.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, resistive random access memory (RRAM), phase-change random access memory (PRAM), ferroelectric random access memory (FRAM), magnetic random access memory (MRAM), an E-fuse, etc.

SUMMARY

The disclosed technology in this patent document includes memory circuits or devices and their applications in electronic devices or systems and various implementations of an electronic device in which the switching current of a variable resistance element that switches between different resistance states is reduced/minimized.

In one aspect, an electronic device is provided to include a semiconductor memory unit that includes: a variable resistance element comprising a first magnetic layer with a pinned magnetization, a second magnetic layer with a non-pinned magnetization direction, and a non-magnetic layer interposed between the first magnetic layer and the second magnetic layer, wherein the variable resistance element has more angled edges than rounded edges as a damping constant of the second magnetic layer increases.

Implementations of the above electronic device may include one or more the following.

The variable resistance element may include only the rounded edges or only the angled edges. The variable resistance element may be symmetrical with respect to a center line of the variable resistance element. The variable resistance element may be asymmetrical with respect to a center line of the variable resistance element. The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is a part of the memory unit in the microprocessor. The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is a part of the cache memory unit in the processor. The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor performs the operation using the program and the information when executing the program; and an interface device configured to perform communication between at least one of the processor, the auxiliary memory device and the main memory device and the outside, wherein the semiconductor memory unit that includes the variable resistance element is a part of the auxiliary memory device or the main memory device in the processing system. The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system. The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is a part of the memory or the buffer memory in the memory system.

In another aspect, an electronic device is provided to include a semiconductor memory unit that includes: a variable resistance element having a plurality of rounded edges and being symmetrical with respect to a center line of the variable resistance element, wherein the variable resistance element comprises: a first magnetic having a pinned magnetization direction; a second magnetic layer having a non-pinned magnetization direction and having a damping constant ranging from 0.0001 to 0.05; and a non-magnetic layer interposed between the first magnetic layer and the second magnetic layer.

In another aspect, an electronic device is provided to include a semiconductor memory unit that includes: a variable resistance element having a plurality of edges comprising at least one angled edge or at least one rounded edge and being symmetrical with reference to a center line of the variable resistance element, wherein the variable resistance element comprises: a first magnetic layer having a pinned magnetization direction; a second magnetic layer having a non-pinned magnetization direction and having a damping constant ranging from 0.001 to 0.15; and a non-magnetic layer interposed between the first magnetic layer and the second magnetic layer.

Implementations of the above electronic device may include one or more the following.

The variable resistance element may have more angled edges than rounded edges as the damping constant of the second magnetic layer increases.

In another aspect, an electronic device is provided to include a semiconductor memory unit that includes: a variable resistance element having a plurality of edges and being asymmetrical with respect to a center line of the variable resistance element, wherein the variable resistance element comprises: a first magnetic layer having a pinned magnetization direction; a second magnetic layer having a non-pinned magnetization direction and having a damping constant ranging from 0.0007 to 0.1; and a non-magnetic layer interposed between the first magnetic layer and the second magnetic layer.

Implementations of the above electronic device may include one or more the following.

The variable resistance element may include at least one angled edge or at least one rounded edge. The variable resistance element may include only the rounded edges or only the angled edges. The variable resistance element may have more angled edges than rounded edges as the damping constant of the second magnetic layer increases.

In another aspect, an electronic device is provided to include a variable resistance element, the variable resistance element comprising: a first magnetic layer with a pinned magnetization direction; a second magnetic layer with a non-pinned magnetization direction; and a non-magnetic layer interposed between the first magnetic layer and the second magnetic layer, wherein, when viewed above, the second magnetic layer is in a first shape and a reference magnetic layer is a circle, wherein the second magnetic layer and the reference magnetic layer are substantially the same as each other in material and in size, but different from each other in shape, wherein, at a reference damping constant, the second magnetic layer and the reference magnetic layer have substantially the same switching current density as each other, wherein the damping constant of the second magnetic layer is higher than the reference damping constant, and wherein the first shape has at least one angled edge.

Implementations of the above electronic device may include one or more the following.

The first shape may be a polygon having four or more angled edges or is in an irregular shape. The second magnetic layer in the first shape may have a switching current density lower than the reference magnetic layer. The reference damping constant may be about 0.015.

In another aspect, an electronic device is provided to include a variable resistance element, the variable resistance element comprising: a first magnetic layer with a pinned magnetization direction; a second magnetic layer with a non-pinned magnetization direction; and a non-magnetic layer interposed between the first magnetic layer and the second magnetic layer, wherein the second magnetic layer is an ellipse or in an irregular shape.

These and other aspects, implementations and associated advantages are described in greater detail in the drawings, the description and the claims.

DETAILED DESCRIPTION

Figure 1A:
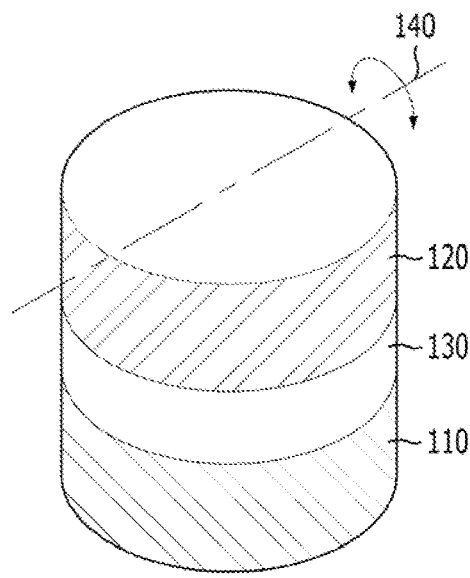
FIGS. 1A to 1D are perspective views of a variable resistance element in accordance with an implementation of this patent document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" "over" a second layer or "on" or "over" a substrate, the first layer may be directly formed on the second layer or the substrate but may also represent a structure where one or more other intermediate layers may exist between the first layer and the second layer or the substrate.

An implementation provides an electronic device capable of reducing the switching current of a variable resistance element that switches between different resistance states.

More particularly, an implementation provides an electronic device capable of reducing the switching current of a variable resistance element having a non-magnetic layer interposed between two magnetic layers, for example, a Magnetic Tunnel Junction (MTJ). As discussed in this document, the switching current is a threshold current necessary to change the resistance state of the variable resistance element.

An MTJ includes a first magnetic layer having a pinned magnetization direction, a second magnetic layer having a free magnetization direction, and a non-magnetic layer interposed between the first magnetic layer and the second magnetic layer. The first magnetic layer has pinned magnetization in a given direction. The first magnetic layer is also called a 'reference layer' or a 'pinned layer'. The second magnetic layer has a random magnetization direction. The magnetization direction of the second magnetic layer may be parallel to the magnetization direction of the first pinned layer or non-parallel (i.e. anti-parallel, or substantially 180 degrees from the magnetization direction of the first magnetic layer) to the magnetization direction of the first pinned layer. The second magnetic layer is also called a 'storage layer' or a 'free layer'. The magnetization direction of the second magnetic layer may be changed by the injection of current or the application of a magnetic field. Furthermore, the non-magnetic layer is called a 'tunnel barrier layer'.

In general, in order to reduce the switching current of the MTJ including the first magnetic layer, the second magnetic layer, and the non-magnetic layer, a method of controlling materials that form the MTJ or controlling physical properties of the magnetic layer and the non-magnetic layer may be used. For example, a method of replacing materials serving as the magnetic layer with a material with low saturation magnetization Ms and a low magnetic anisotropy field Hk may be used. In addition, a method of changing the physical properties of the magnetic layer using the implantation of impurities is used. Reduction of the switching current of the MTJ using the method of controlling materials or physical properties is limited because the aforementioned method deteriorates other characteristics of the MTJ, for example, thermal stability.

Accordingly, an implementation provides a method capable of reducing the switching current of the MTJ without changing the materials forming of a variable resistance element or without changing the physical properties of the variable resistance element. To this end, an implementation provides an electronic device capable of reducing the switching current of an MTJ by changing the shape of the MTJ in response to a damping constant α of a free magnetic layer. For reference, the damping constant is material property and may be different depending on the material that forms the magnetic layer. As the damping constant of a non-pinned (or free) magnetic layer increases, the switching current of a variable resistance element including the non-pinned magnetic layer (e.g., an MTJ) increases. See FIG. 4. In other words, the switching current of the MTJ is proportional to the damping constant of the free magnetic layer.

FIGS. 1A to 1D are perspective views of a variable resistance element in accordance with an implementation.

As shown in FIGS. 1A to 1D, the variable resistance element in accordance with an implementation includes a first magnetic layer 110 configured to have a pinned magnetization direction, a second magnetic layer 120 configured to have a non-pinned magnetization direction, and a non-magnetic layer 130 interposed between the first magnetic layer 110 and the second magnetic layer 120. The variable resistance element may further include a first electrode (not shown) configured to contact the first magnetic layer 110 and a second electrode (not shown) configured to contact the second magnetic layer 120. The first electrode and the second electrode may be metallic layers.

Each of the first magnetic layer 110 and the second magnetic layer 120 may be a single layer or multiple layers that include ferromagnetic materials, for example, a Fe—Pt alloy, a Fe—Pd alloy, a Co—Pd alloy, a Co—Pt alloy, a Co—Fe alloy, a Fe—Ni—Pt alloy, a Co—Fe—Pt alloy, or a Co—Ni—Pt alloy. Each of the first magnetic layer 110 and the second magnetic layer 120 may further include impurities, such as boron (B), but the impurity is not limited to boron. The first magnetic layer 110 and the second magnetic layer 120 may have horizontal magnetization or vertical magnetization or both. For example, both the first magnetic layer 110 and the second magnetic layer 120 may have horizontal magnetization or vertical magnetization. In another embodiment, the first magnetic layer 110 may have horizontal magnetization and the second magnetic layer 120 may have vertical magnetization. For another example, the first magnetic layer 110 may have both vertical magnetization and horizontal magnetization, and the second magnetic layer 120 may have vertical magnetization. The non-magnetic layer 130 may be a single layer or multiple layers that include insulating materials, for example, oxide, such as $Al_2O_3$, MgO, CaO, SrO, TiO, VO, or NbO, but not limited thereto.

Sidewalls of the first magnetic layer 110, the second magnetic layer 120, and the non-magnetic layer 130 may be aligned. Furthermore, when viewed from above, the variable resistance element may have a plurality of edges. In order to reduce switching current, more angled edges are formed than rounded edges as the damping constant of the second magnetic layer 120 increases. When viewed from above, the variable resistance element may be symmetrical or asymmetrical with respect to center lines 140.

The relation between the damping constant of the second magnetic layer 120 and the shape of the variable resistance element for reducing the switching current of the variable resistance element is described in detail below with reference to FIGS. 1A to 1D.

First, as shown in FIG. 1A, when viewed from above, the variable resistance element may include a plurality of rounded edges and be symmetrical with respect to the center line 140. The variable resistance element may include the second magnetic layer 120 having a damping constant ranging from approximately 0.0001 approximately 0.05. Here, the rounded edge means the point where a tangent value exists. The angled edge means all edges other than the rounded edge. At the angled edge, no tangent value is available. A shape formed of rounded edges only and symmetrical with respect to the center line 140 may include a circle shape, an ellipse shape, a U shape, etc.

Figure 1B:
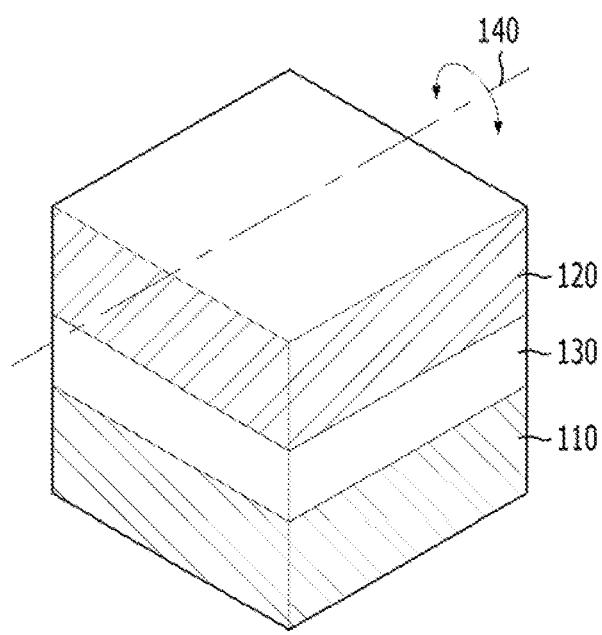

As shown in FIG. 1B, when viewed from above, a variable resistance element may include a plurality of angled edges and be symmetrical with respect to the center line 140. The variable resistance element may include a second magnetic layer 120 having a damping constant greater than that of the second magnetic layer 120 of FIG. 1A. For example, when viewed from above, a variable resistance element may have a plurality of angled edges and be symmetrical with respect to the center line 140 so that a second magnetic layer 120 having a damping constant, ranging from approximately 0.005 to approximately 0.2 can be employed. A shape configured to have a plurality of angled edges and to be symmetrical with respect to the center line 140 may include a triangle, a rectangle, a polygon, a cross shape, or an irregular shape.

Figure 1C:
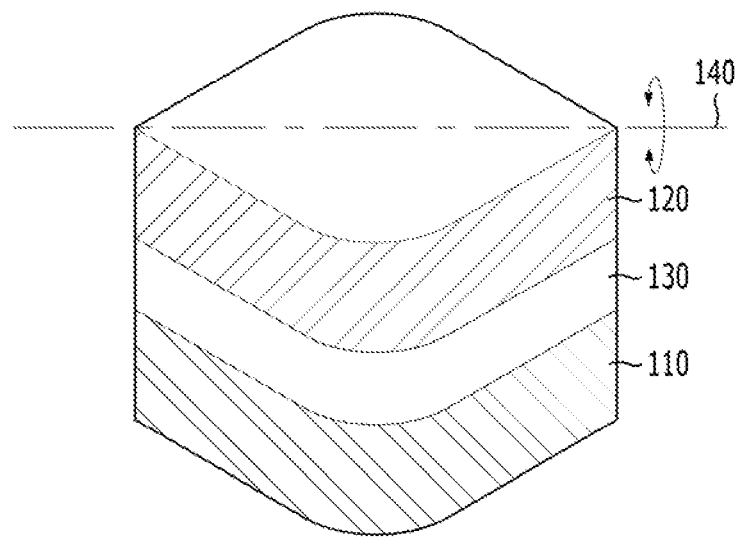

As shown in FIG. 1C, a variable resistance element may be in a plane shape which includes at least one angled edge or at least one rounded edge and is symmetrical with respect to the center line 140. The variable resistance element shown in FIG. 1C may include a second magnetic layer 120 having a damping constant between the damping constant range of the second magnetic layer 120 illustrated in FIG. 1A and the damping constant range of the second magnetic layer 120 illustrated in FIG. 1B. For example, a variable resistance element, which includes at least one angled edge and is symmetrical with respect to the center line 140 when viewed from above, may include a second magnetic layer 120 having a damping constant ranging from approximately 0.001 to approximately 0.15.

Figure 1D:
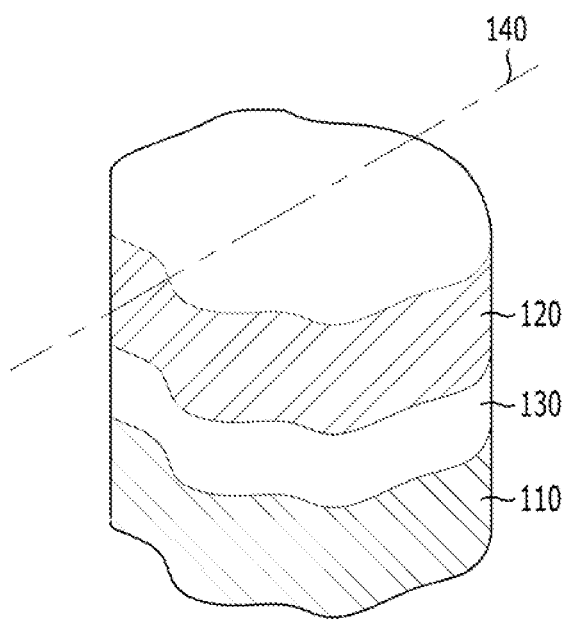

As shown in FIG. 1D, when viewed from above, a variable resistance element may be asymmetrical with respect to the center line 140. The variable resistance element may include a second magnetic layer 120 having a damping constant ranging from approximately 0.0007 to approximately 0.1. Here, when viewed from above, the variable resistance element may have either angled shape(s) only, rounded edge(s) only, or both angled edge(s) and rounded edge(s). An asymmetrical shape, with respect to the center line 140, is usually in an irregular shape but it is not limited thereto.

As described above, the variable resistance element accordance with an implementation may reduce switching current of the variable resistance element by changing the shape of the second magnetic layer 120 having a non-pinned magnetization direction in response to a damping constant of the second magnetic layer 120, without changing materials forming the variable resistance element or without changing the physical properties of the variable resistance element.

The variable resistance element that switches between different resistance states has recently received attention because it may be used in various fields. For example, the variable resistance element may be used as for storing data. For an example, the variable resistance element in accordance with an implementation may be applied to the storage of a memory cell described below with reference to FIGS. 2A and 2B.

Figure 2A:
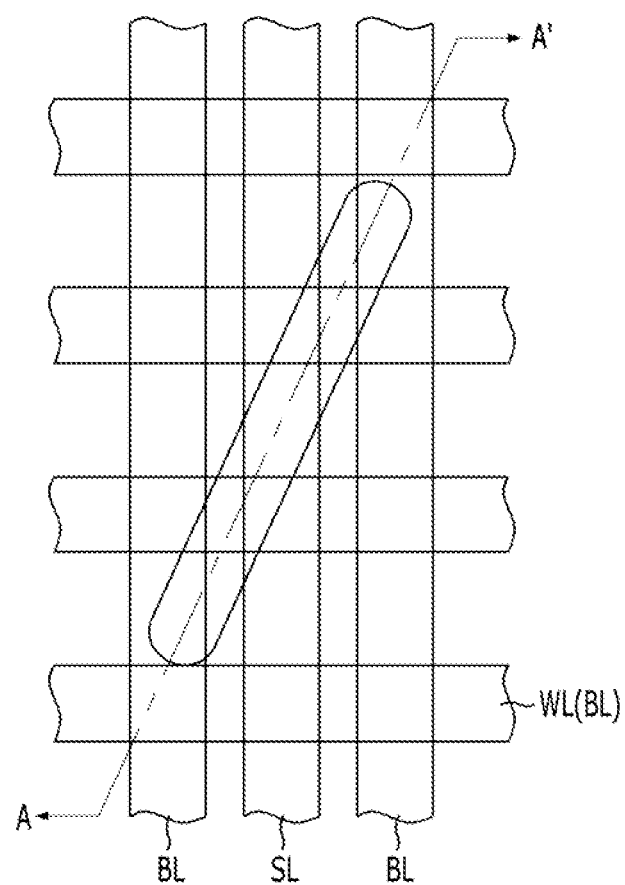
FIGS. 2A and 2B are diagrams showing an electronic device including a variable resistance element in accordance with an implementation of this patent document.
Figure 2B:
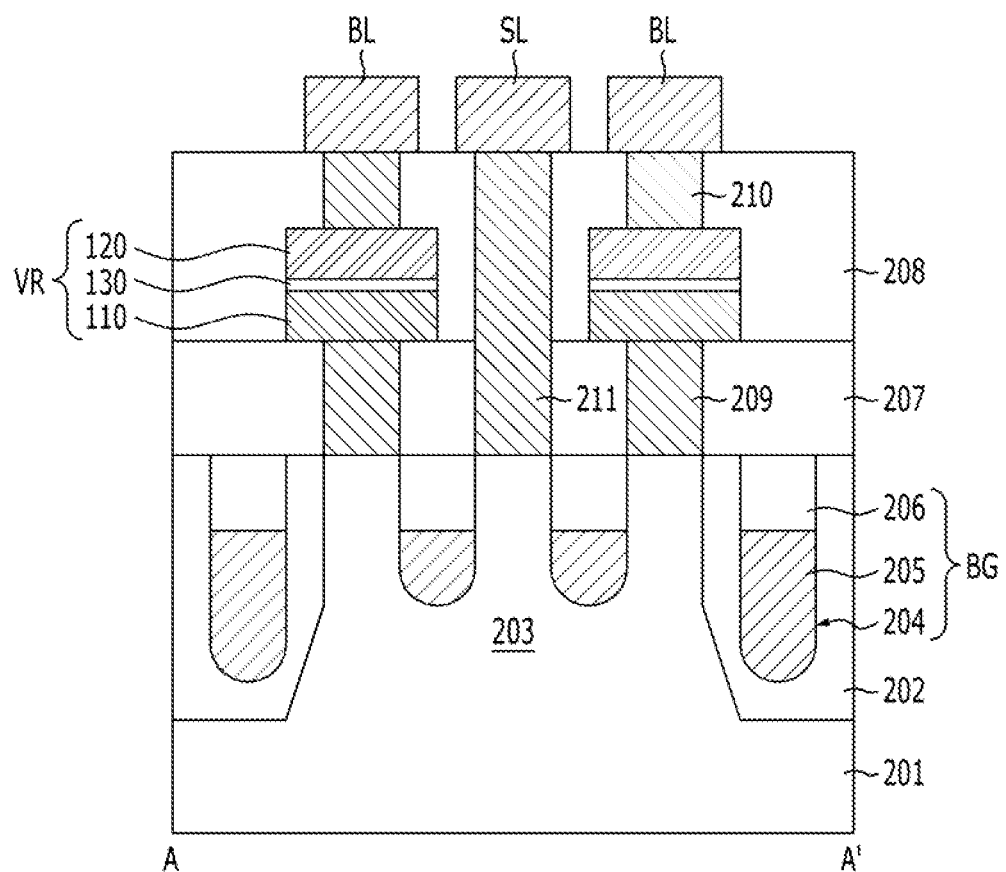

FIGS. 2A and 2B are diagrams showing an electronic device including variable resistance elements in accordance with an implementation. FIG. 2A is a plan view of the electronic device, and FIG. 2B is a cross-sectional view of the electronic device taken along line A-A' of FIG. 2A.

As shown in FIGS. 2A and 2B, the electronic device including the variable resistance elements VR may include word lines WL including switching elements and bit lines BL and a source line SL crossing the word lines WL. The variable resistance elements VR may be placed under the bit lines BL.

Isolation layers 202 configured to define an active region 203, and Buried Gates BG configured to cross both the active region 203 and the isolation layers 202 are formed in a substrate 201. The Buried Gates BG may include a trench 204 formed in the substrate 201, a gate insulating layer (not shown) formed along a surface of the trench 204, a gate electrode 205 configured to fill a lower part of the trench 204, and a sealing layer 206 configured to fill an upper part of the trench 204 over the gate electrode 205. Source/drains (not shown) are formed in the active region 203 on both sides of the BG, and the source/drains and the BG operate as a switching element. Furthermore, the word line WL may include the BG.

A first interlayer insulating layer 207 is formed on the substrate 201, and first contact plugs 209 each coupling one end of the switching element to the variable resistance element VR are formed over the active region 203 and the isolation layers 202. The variable resistance elements VR and a second interlayer insulating layer 208 covering the variable resistance elements VR are formed on the first interlayer insulating layer 207. The bit lines BL and the source line SL are formed on the second interlayer insulating layer 208 and each extend in a direction to cross the word lines WL. Second contact plugs 210 each coupling the variable resistance element VR and the bit line BL are formed in the second interlayer insulating layer 208. A third contact plug 211 coupling the source line SL and the other end of the switching element is formed through the first interlayer insulating layer 207 and the second interlayer insulating layer 208.

Each of the variable resistance elements VR may include the first magnetic layer 110 configured to have a pinned magnetization direction, the second magnetic layer 120 configured to have a non-pinned magnetization direction, and the non-magnetic layer 130 interposed between the first magnetic layer 110 and the second magnetic layer 120. Furthermore, the variable resistance element VR may further include a first electrode (not shown) configured to contact the first magnetic layer 110, and a second electrode (not shown) configured to contact the second magnetic layer 120. Sidewalls of the first magnetic layer 110, the second magnetic layer 120, and the non-magnetic layer 130 may be aligned to each other. Furthermore, when viewed from above, the variable resistance element VR may have angled edge(s), rounded edge(s), or a combination thereof. Switching current of the variable resistance element VR may increase by increasing the damping constant of the non-pinned magnetic layer (or the second magnetic layer). The damping constant of the non-pinned magnetic layer may increase by providing more angled edges to the variable resistance element VR. The relationship between the damping constant of the second magnetic layer and the shape of the variable resistance element VR has been described above, and thus the description thereof is omitted.

The aforementioned electronic device includes variable resistance elements that are each capable of reducing the switching current of the variable resistance element by changing the shape of the variable resistance element so that the damping constant of the second magnetic layer 120 having a non-pinned magnetization direction increases. According to an embodiment, there is no need to change materials that form the variable resistance element or the physical properties of the variable resistance element. Accordingly, power consumption of the electronic device may be reduced, and the degree of integration of the electronic devices may be increased.

An example of a method of simulating (or predicting) a shape of the variable resistance element in accordance with an implementation and an example of a process of applying the method to a mass-production process are described below with reference to FIGS. 3 and 4. The simulation shows a change of the switching current in response to a change of the damping constant of a magnetic layer having a non-pinned magnetization direction.

Figure 3:
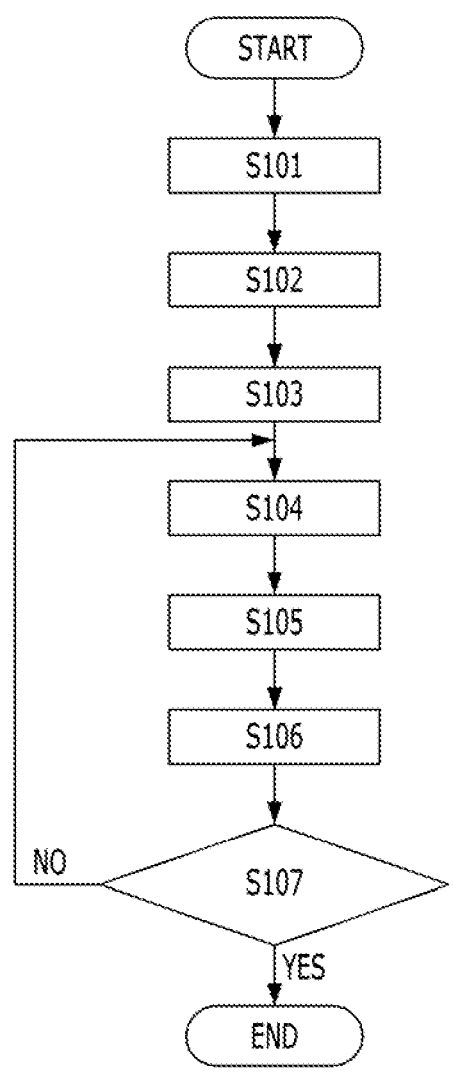
FIG. 3 is a flowchart illustrating a method of forming a variable resistance element in accordance with an implementation of this patent document.
Figure 4:
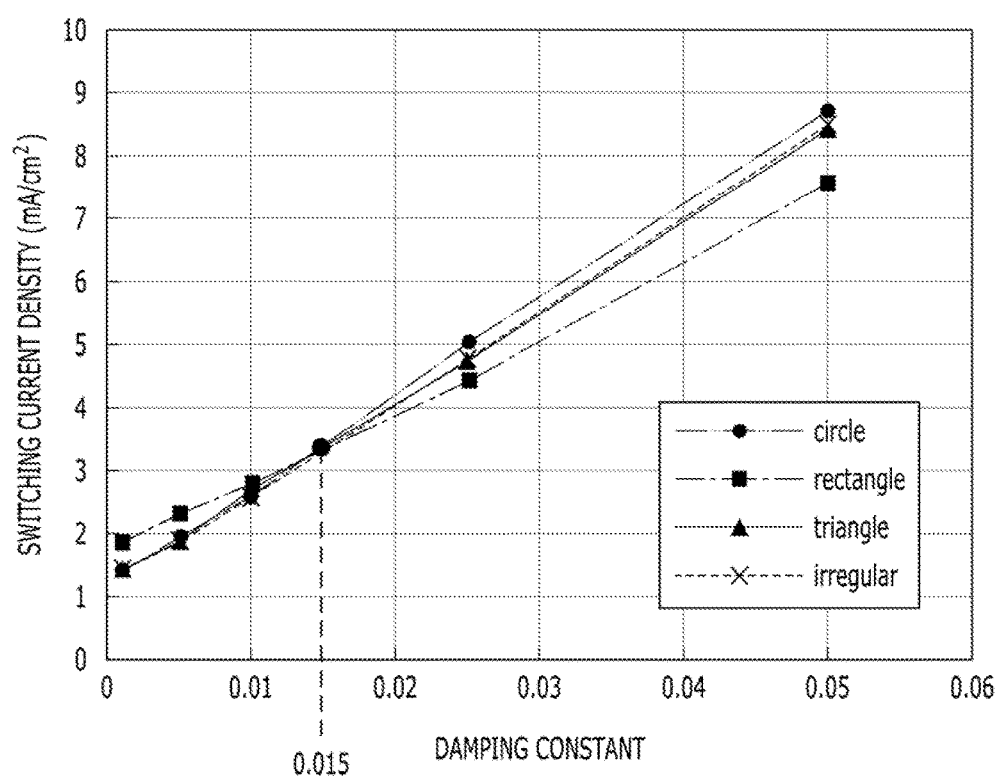
FIG. 4 is a graph showing switching current density according to a change of a damping constant.

FIG. 3 is a flowchart illustrating a method of forming the variable resistance element in accordance with an implementation, and FIG. 4 is a graph showing switching current density depending on a damping constant.

A method of forming a variable resistance element in accordance with an implementation is described below. Simulations were made to predict a change of switching current density of the variable resistance element according to a change of the damping constant of the magnetic layer having a non-pinned magnetization direction. In addition, a real experiment was made. For the real experiment, variable resistance elements were fabricated using data obtained from the simulations. Then, switching current density values of the variable resistance elements were measured. A series of processes may be performed for comparing the data obtained from the simulations with the measured switching current density and then reading the results of the comparison. The simulations may be performed using LLG simulations.

More particularly, as shown in FIG. 3, at step S101, a plurality of the variable resistance elements having different shapes are provided. It is assumed that the plurality of variable resistance elements has the same parameters, for example, in materials, area, and thickness, but not shape. Four variable resistance elements, which are in a circle, an ellipse, a rectangle, or an irregular shape, are used.

Next, a change of switching current density of the variable resistance element according to a change of a damping constant of the magnetic layer having a non-pinned magnetization direction is simulated for respective shapes through Landau-Lifshitz-Gilbert (LLG) simulations at step S102. A graph is obtained in which a change of the damping constant for the plane shapes is the same and a change of switching current density of the variable resistance element according to a change of the damping constant of the non-pinned magnetic layer is linear. A change of switching current density of the variable resistance element according to a change of the damping constant of the magnetic layer having the non-pinned magnetization layer in respective shapes is shown in the graph of FIG. 4. From the graph of FIG. 4, it may be seen that switching current density is different depending on the shape of the variable resistance elements under the condition that all parameters are the same except the shape.

More specifically, as mentioned above, as the damping constant of a non-pinned (or free) magnetic layer increases, the switching current of a variable resistance element including the non-pinned magnetic layer increases. This is confirmed from FIG. 4. In FIG. 4, each graph has a positive linear slope. However, the slopes have different magnitude.

A damping constant corresponding to a point where the four shapes have the same switching current density is picked using the graph of FIG. 4 at step S103. That is, a damping constant corresponding to a point where the four linear graphs of the respective shapes meet together is defined as a reference value. A damping constant is a characteristic unique to each material, and an optimal shape may be determined based on the reference value of the damping constant. For example, in the graph of FIG. 4, the reference value is set to 0.015.

Shapes of the variable resistance element capable of reducing switching current are defined based on the reference value at step S104. More particularly, from the graph of FIG. 4, when the damping constant is greater than 0.015, the switching current is lowest when the shape is a rectangle, and when the damping constant is less than 0.015, the switching current is the lowest if the shape is a circle. The results reveal that the difference between the switching currents is about 35% depending on the shape et the variable resistance element.

Next, actual variable resistance elements are formed in various shapes based on the simulation results at step S105. The variable resistance elements may be formed using various known methods. The variable resistance elements, which are actually formed as such and designed to satisfy a given specification, may be slightly different from the given specification in values, in shapes, or in characteristics.

Switching current density of the respective variable resistance element is measured at step S106. In this case, a damping constant of a magnetic layer having a non-pinned magnetization direction of the formed variable resistance element is also calculated. The damping constant of the magnetic layer having the non-pinned magnetization direction may be measured using a ferromagnetic resonance method.

The actual damping constant of the magnetic layer having the non-pinned magnetization direction and the measured switching current density are compared with the simulated (or predicted) damping constant and the simulated (or predicted) switching current density, respectively, at step S107. If the difference between the measured switching current density and the simulated switching current density falls within a given tolerance (or an allowable error range), such results may be applied to a mass-production process. If the difference between the measured switching current density and the simulated switching current density is beyond the given tolerance (or the allowable error range), an optimal shape is determined by repeatedly performing the steps S104 through S107. The step S104 defines a shape of the formed variable resistance element which may reduce the switching current of the formed variable resistance element based on the reference value. The step S107 compares the measured switching current density of the formed variable resistance element with the simulated switching current density.

The above and other memory circuits or semiconductor devices based on the disclosed technology may be used in various devices or systems. FIGS. 5-12 provide some examples of devices or systems that may implement the memory circuits according to an implementation.

Figure 5:
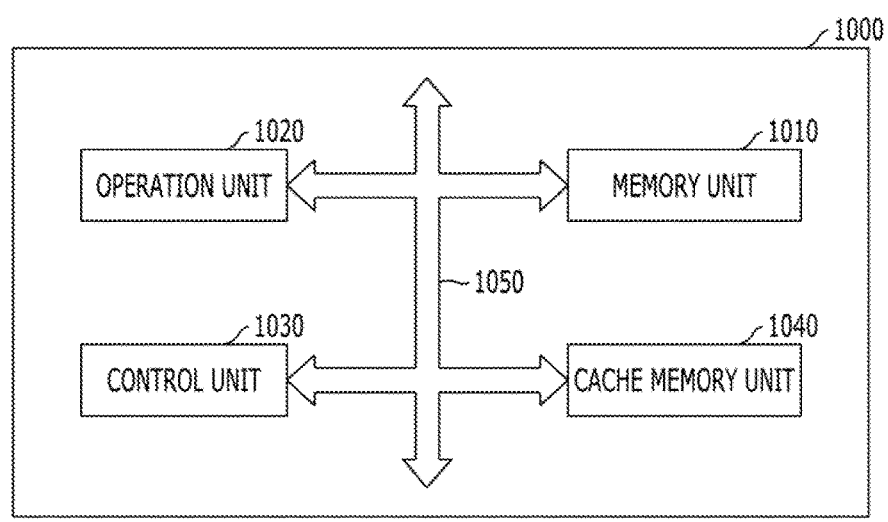
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital' signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described electronic devices in accordance with the implementations. For example, the memory unit 1010 may include a variable resistance element capable of storing data using a characteristic that they are switched between different resistant states. The variable resistance element may include a first magnetic layer configured to have a magnetization direction pinned, a second magnetic layer configured to have a magnetization direction not pinned, and a non-magnetic layer interposed between the first magnetic layer and the second magnetic layer. Furthermore, the variable resistance element may have plane shapes including a plurality of edges. The plurality of edges may include angled edges or rounded edges. In order to reduce switching current of the variable resistance element, the number of angled edges may be larger than the number of rounded edges as the damping constant of the second magnetic layer increases. Through this, consumption power of the memory unit 1010 may be reduced, and capacity of the memory unit 1010 may be maximized by reducing a size thereof. As a consequence, the degree of integration of the microprocessor 1000 may become easy increased.

The operation unit 1020 may perform four arithmetical' operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which may temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
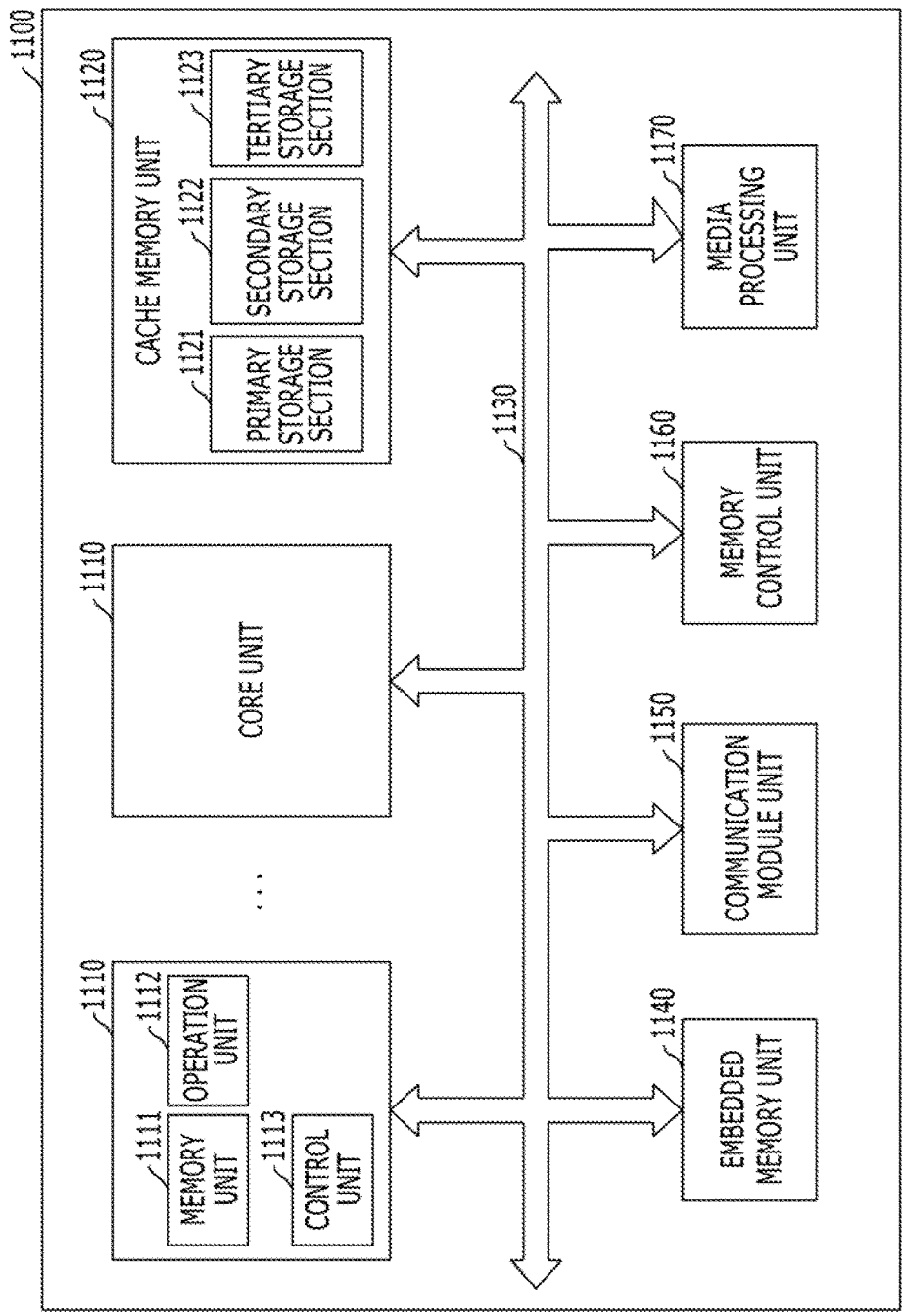
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, the processor 1100 may improve performance and realize mufti-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100 as a processor register a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122 and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

At least one storage section of the primary storage section 1121, the secondary storage section 1122 and the tertiary storage section 1123 of the cache memory unit 1120 may include one or more of the above-described electronic devices in accordance with the implementations. For example, the cache memory unit 1120 may include a variable resistance element capable of storing data using a characteristic that they are switched between different resistant states. The variable resistance element may include a first magnetic layer configured to have a magnetization direction pinned, a second magnetic layer configured to have a magnetization direction not pinned, and a non-magnetic layer interposed between the first magnetic layer and the second magnetic layer. Furthermore, the variable resistance element may have plane shapes including a plurality of edges. The plurality of edges may include angled edges or rounded edges. In order to reduce switching current of the variable resistance element, the number of angled edges may be larger than the number of rounded edges as the damping constant of the second magnetic layer increases. Through this, consumption power of the cache memory unit 1120 may be reduced, and capacity of the cache memory unit 1120 may be maximized by reducing a size thereof. As a consequence, the degree of integration of the processor 1100 may become easy increased.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which may transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics) SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC) a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
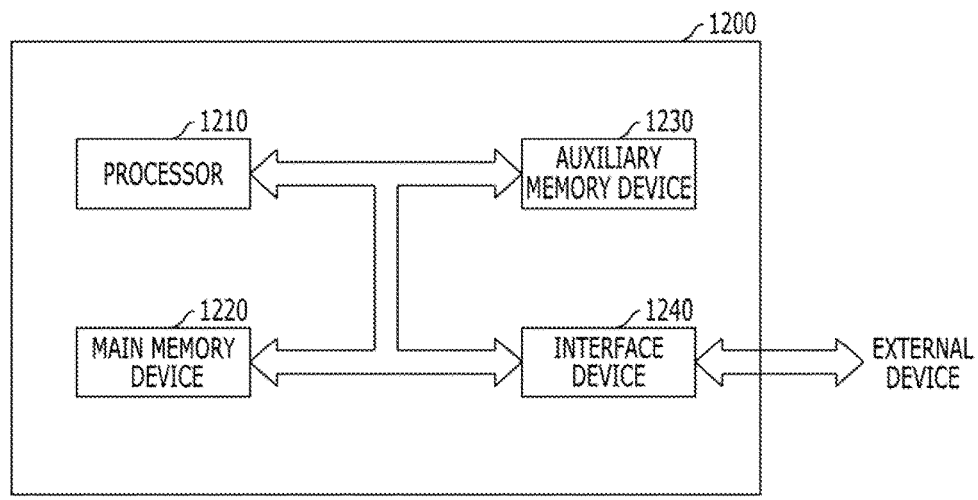
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor a graphic processing unit (GPU), an application processor (AP), a digital signal processor (DSP), and so on.

The main memory device 1220 is a storage which may temporarily store, call and execute program codes or data from the auxiliary memory device 1230 when programs are executed and may conserve memorized contents even when power supply is cut off. The main memory device 1220 may include one or more of the above-described electronic devices in accordance with the implementations. For example, the main memory device 1220 may include a variable resistance element capable of storing data using a characteristic that they are switched between different resistant states. The variable resistance element may include a first magnetic layer configured to have a magnetization direction pinned, a second magnetic layer configured to have a magnetization direction not pinned, and a non-magnetic layer interposed between the first magnetic layer and the second magnetic layer. Furthermore, the variable resistance element may have plane shapes including a plurality of edges. The plurality of edges may include angled edges or rounded edges. In order to reduce switching current of the variable resistance element, the number of angled edges may be larger than the number of rounded edges as the damping constant of the second magnetic layer increases. Through this, consumption power of the main memory device 1220 may be reduced, and capacity of the main memory device 1220 may be maximized by reducing a size thereof. As a consequence, the degree of integration of the system 1200 may become easy increased, and high performance and the portability of the system 1200 may be achieved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the electronic devices according to the implementations, but may include a static random access memory (SRAM), a dynamic random access memory (DRAM), and so on, of a volatile memory type in which all contents are erased when power supply is cut off. The auxiliary memory device 1230 is a memory device for storing program codes or data. While the speed of the auxiliary memory device 1230 is slower than the main memory device 1220, the auxiliary memory device 1230 may store a larger amount of data.

The auxiliary memory device 1230 may include one or more of the above-described electronic devices in accordance with the implementations. For example, the auxiliary memory device 1230 may include a variable resistance element capable of storing data using a characteristic that they are switched between different resistant states. The variable resistance element may include a first magnetic layer configured to have a magnetization direction pinned, a second magnetic layer configured to have a magnetization direction not pinned, and a non-magnetic layer interposed between the first magnetic layer and the second magnetic layer. Furthermore, the variable resistance element may have plane shapes including a plurality of edges. The plurality of edges may include angled edges or rounded edges. In order to reduce switching current of the variable resistance element, the number of angled edges may be larger than the number of rounded edges as the damping constant of the second magnetic layer increases. Through this, consumption power of the auxiliary memory device 1230 may be reduced, and capacity of the auxiliary memory device 1230 may be maximized by reducing a size thereof. As a consequence, the degree of integration of the system 1200 may become easy increased, and high performance and the portability of the system 1200 may be achieved.

Also the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the electronic devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
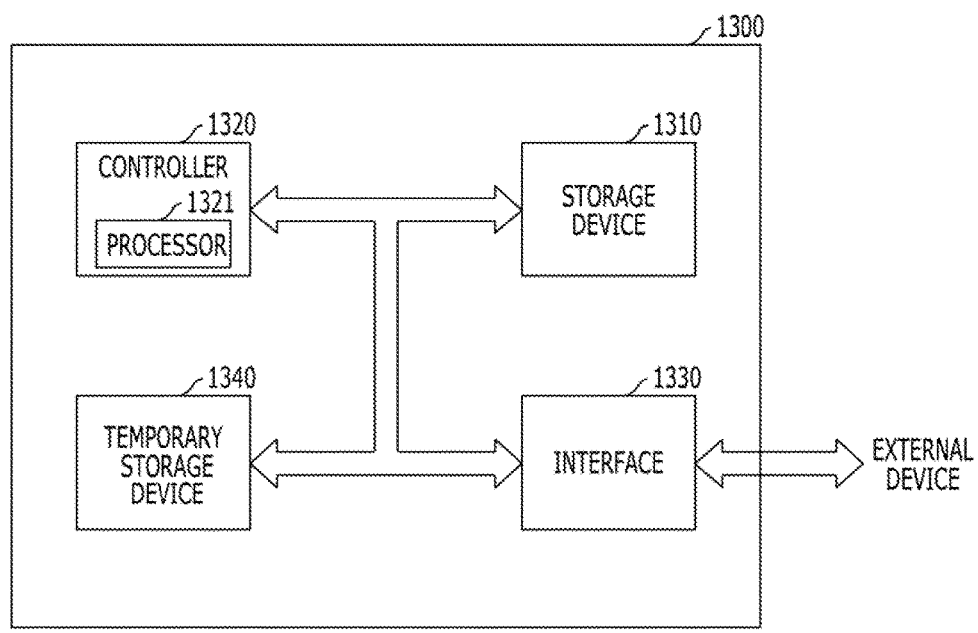
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics) SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 may store data temporarily for efficiently transferring data between the interface 1330 and the storage device 1310 according to diversifications and high performance of an interface with an external device, a controller and a system.

Any of the storage device 1310 and the temporary storage device 1340 for temporarily storing data may include one or more of the above-described electronic devices in accordance with the implementations. The storage device 1310 or the temporary storage device 1340 may include a variable resistance element capable of storing data using a characteristic that they are switched between different resistant states. The variable resistance element may include a first magnetic layer configured to have a magnetization direction pinned, a second magnetic layer configured to have a magnetization direction not pinned, and a non-magnetic layer interposed between the first magnetic layer and the second magnetic layer. Furthermore, the variable resistance element may have plane shapes including a plurality of edges. The plurality of edges may include angled edges or rounded edges. In order to reduce switching current of the variable resistance element, the number of angled edges may be larger than the number of rounded edges as the damping constant of the second magnetic layer increases. Through this, consumption power of the storage device 1310 and the temporary storage device 1340 may be reduced, and capacity of the storage device 1310 and the temporary storage device 1340 may be maximized by reducing a size thereof. As a consequence, the degree of integration of the data storage system 1300 may become easy increased, and high performance and the portability of the data storage system 1300 may be achieved.

Figure 9:
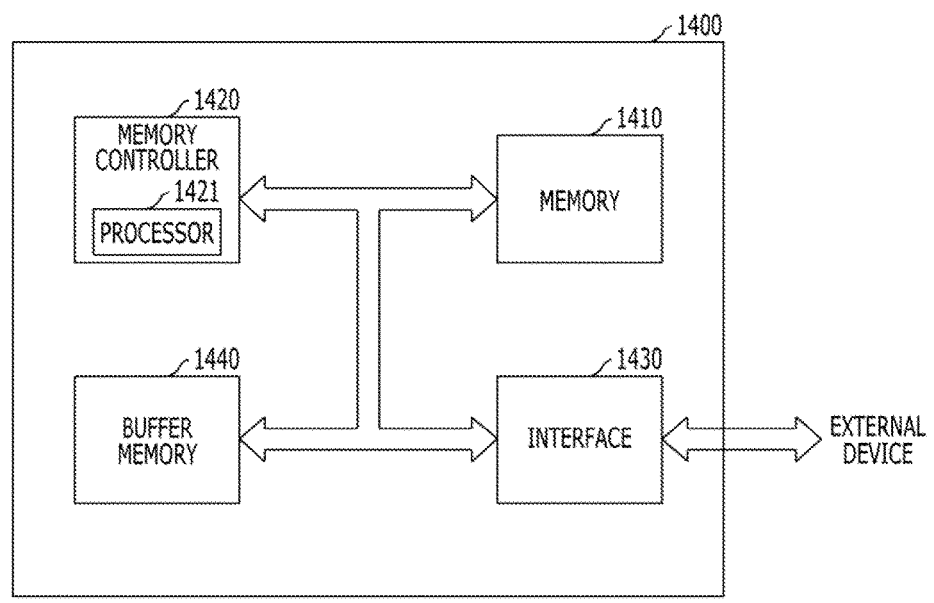
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described electronic devices in accordance with the implementations. For example, the memory 1410 may include a variable resistance element capable of storing data using a characteristic that they are switched between different resistant states. The variable resistance element may include a first magnetic layer configured to have a magnetization direction pinned, a second magnetic layer configured to have a magnetization direction not pinned, and a non-magnetic layer interposed between the first magnetic layer and the second magnetic layer. Furthermore, the variable resistance element may have plane shapes including a plurality of edges. The plurality of edges may include angled edges or rounded edges. In order to reduce switching current of the variable resistance element, the number of angled edges may be larder than the number of rounded edges as the damping constant of the second magnetic layer increases. Through this, consumption power of the memory 1410 may be reduced, and capacity of the memory 1410 may be maximized by reducing a size thereof. As a consequence, the degree of integration of the memory system 1400 may easily increase, and high performance and the portability of the memory system 1400 may be achieved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described electronic devices in accordance with the implementations. The buffer memory 1440 may include may include a variable resistance element capable of storing data using a characteristic that they are switched between different resistant states. The variable resistance element may include a first magnetic layer configured to have a magnetization direction pinned, a second magnetic layer configured to have a magnetization direction not pinned, and a non-magnetic layer interposed between the first magnetic layer and the second magnetic layer. Furthermore, the variable resistance element may have plane shapes including a plurality of edges. The plurality of edges may include angled edges or rounded edges. In order to reduce switching current of the variable resistance element, the number of angled edges may be larger than the number of rounded edges as the damping constant of the second magnetic layer increases. Through this, consumption power of the buffer memory 1440 may be reduced, and capacity of the buffer memory 1440 may be maximized by reducing a size thereof. As a consequence, the degree of integration of the memory system 1400 may become easy increased, and high performance and the portability of the memory system 1400 may be achieved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the electronic devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

In accordance with the aforementioned method of forming a variable resistance element, an optimal shape is suggested which is capable of reducing the switching current of the variable resistance element without changing its materials or the physical properties of its materials. The optimal plane shape may also be modified and supplemented in a mass-production process. That is, a variable resistance element may be provided which is capable of easily reducing its switching current and being subject to a mass-production at a low cost.

In accordance with an implement, the switching current of a variable resistance element may be reduced using a method of modifying the shape of the variable resistance element without changing materials that form of the variable resistance element or without changing the physical properties of the variable resistance element.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations may be made based on what is described and illustrated in this patent document.

What is claimed is:

1. An electronic device comprising a semiconductor memory unit that includes:
a variable resistance element comprising a first magnetic layer with a pinned magnetization direction, a second magnetic layer with a non-pinned magnetization direction, and a non-magnetic layer interposed between the first magnetic layer and the second magnetic layer,
wherein, the variable resistance element has more angled edges than rounded edges such that a switching current is reduced as a damping constant of the second magnetic layer increases, and
wherein a shape of the variable resistance element is changed according to a change of the damping constant value,
wherein the variable resistance element includes only the rounded edges or only angled edges.

2. The electronic device according to claim 1, wherein, the variable resistance element is symmetrical with respect to a center line of the variable resistance element.

3. The electronic device according to claim 1, wherein, the variable resistance element is asymmetrical with respect to a center line of the variable resistance element.

4. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is a part of the cache memory unit in the processor.

5. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor performs the operation using the program and the information when executing the program; and
an interface device configured to perform communication between at least one of the processor, the auxiliary memory device and the main memory device and the outside,
wherein the semiconductor memory unit that includes the variable resistance element is a part of the auxiliary memory device or the main memory device in the processing system.

6. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the variable resistance element is a part of the storage device or the temporary storage device in the data storage system.

7. An electronic device comprising a semiconductor memory unit that includes:
a variable resistance element having a plurality of edges and being asymmetrical with respect to a center line of the variable resistance element such that a switching current is reduced,
wherein the variable resistance element comprises:
a first magnetic layer having a pinned magnetization direction;
a second magnetic layer having a non-pinned magnetization direction and having a damping constant ranging from 0.0007 to 0.1; and
a non-magnetic layer interposed between the first magnetic layer and the second magnetic layer,
wherein the variable resistance element has more angled edges than rounded edges as the damping constant of the second magnetic layer increases, and
wherein a shape of the variable resistance element is changed according to a change of the damping constant value,
wherein the variable resistance element includes at least one angled edge or at least one rounded edge.

8. The electronic device according to claim 7, wherein the variable resistance element includes only the rounded edges or only the angled edges.

9. An electronic device comprising a variable resistance element, the variable resistance element comprising:
a first magnetic layer with a pinned magnetization direction;
a second magnetic layer with a non-pinned magnetization direction; and
a non-magnetic layer interposed between the first magnetic layer and the second magnetic layer,
wherein, the variable resistance element has more angled edges than rounded edges such that a switching current is reduced as a damping constant of the second magnetic layer increases, and a shape of the variable resistance element is changed according to a change of the damping constant value,
wherein, when the second magnetic layer is in a first shape and a reference magnetic layer is a circle in a top view,
wherein the second magnetic layer and the reference magnetic layer are substantially the same as each other in material and in size, but different from each other in shape,
wherein, at a reference damping constant, the second magnetic layer and the reference magnetic layer have substantially the same switching current density as each other,
wherein the damping constant of the second magnetic layer is higher than the reference damping constant, and
wherein the first shape has at least one angled edge,
wherein the second magnetic layer in the first shape has a switching current density lower than the reference magnetic layer.

10. The electronic device of claim 9, wherein the first shape is a polygon having four or more angled edges or is in an irregular shape.

11. The electronic device of claim 9, wherein the reference damping constant is about 0.015.

12. The electronic device according to claim 9, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor performs the operation using the program and the information when executing the program; and
an interface device configured to perform communication between at least one of the processor, the auxiliary memory device and the main memory device and the outside,
wherein the semiconductor memory unit that includes the variable resistance element is a part of the auxiliary memory device or the main memory device in the processing system.

13. The electronic device according to claim 9, further comprising a data storage system which includes:
a storage device configured to store data and conserve stored data regardless of power supply;
a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system.

14. An electronic device comprising a variable resistance element, the variable resistance element comprising:

a first magnetic layer with a pinned magnetization direction;

a second magnetic layer with a non-pinned magnetization direction; and a non-magnetic layer interposed between the first magnetic layer and the second magnetic layer, wherein, the variable resistance element has more angled edges than rounded edges such that a switching current is reduced as a damping constant of the second magnetic layer increases, and a shape of the variable resistance element is changed according to a change of the damping constant value, and wherein the second magnetic layer is an ellipse or in an irregular shape in a top view such that a switching current is reduced, wherein the variable resistance element includes at least one angled edge or at least one rounded edge.

15. The electronic device according to claim 14, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor performs the operation using the program and the information when executing the program; and an interface device configured to perform communication between at least one of the processor, the auxiliary memory device and the main memory device and the outside, wherein the semiconductor memory unit that includes the variable resistance element is a part of the auxiliary memory device or the main memory device in the processing system.

16. The electronic device according to claim 14, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is a part of the storage device or the temporary storage device in the data storage system.

* * * * *